(12) United States Patent
Park et al.

(10) Patent No.: US 9,391,046 B2
(45) Date of Patent: Jul. 12, 2016

(54) SEMICONDUCTOR DEVICE AND METHOD OF FORMING 3D SEMICONDUCTOR PACKAGE WITH SEMICONDUCTOR DIE STACKED OVER SEMICONDUCTOR WAFER

(75) Inventors: Yeonglm Park, Kyoungki-do (KR); HeeJo Chi, Kyoungki-do (KR); HyungMin Lee, Kyoungki-do (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 550 days.

(21) Appl. No.: 13/112,172

(22) Filed: May 20, 2011

(65) Prior Publication Data

US 2012/0292745 A1 Nov. 22, 2012

(51) Int. Cl.
*H01L 21/00* (2006.01)
*H01L 29/40* (2006.01)
(Continued)

(52) U.S. Cl.
CPC ........ *H01L 25/0652* (2013.01); *H01L 23/3128* (2013.01); *H01L 23/36* (2013.01); *H01L 23/481* (2013.01); *H01L 23/552* (2013.01); *H01L 24/14* (2013.01); *H01L 24/17* (2013.01); *H01L 25/50* (2013.01); *H01L 24/48* (2013.01); *H01L 2224/0345* (2013.01); *H01L 2224/03452* (2013.01); *H01L 2224/03462* (2013.01); *H01L 2224/03464* (2013.01); *H01L 2224/0401* (2013.01); *H01L 2224/0557* (2013.01); *H01L 2224/0558* (2013.01); *H01L 2224/05611* (2013.01); *H01L 2224/05624* (2013.01); *H01L 2224/05639* (2013.01);
(Continued)

(58) Field of Classification Search
CPC ............ H01L 2924/14; H01L 25/0657; H01L 25/105; H01L 2924/01079; H01L 2924/010103; H01L 23/3218; H01L 23/36; H01L 23/481; H01L 23/552; H01L 24/14; H01L 25/0652; H01L 25/50; H01L 24/17; H01L 2224/93; H01L 2224/0558; H01L 24/48; H01L 2224/0345; H01L 2224/03452; H01L 2224/03462
USPC .......... 257/E25.018, 778, 685, 723, 724, 621, 257/706, 774, 777, E21.705; 438/106, 108, 438/109, 110, 122, 125, 629, 637
See application file for complete search history.

(56) References Cited

U.S. PATENT DOCUMENTS 6,958,544 B2 * 10/2005 Sunohara .............. H01L 21/304
257/758
6,972,481 B2 * 12/2005 Karnezos ............ H01L 23/3128
257/126

(Continued)

*Primary Examiner* — Thinh T Nguyen
(74) *Attorney, Agent, or Firm* — Robert D. Atkins; Patent Law Group: Atkins and Associates, P.C.

(57) ABSTRACT

A semiconductor device has a substrate and plurality of first semiconductor die having conductive vias formed through the first semiconductor die mounted with an active surface oriented toward the substrate. An interconnect structure, such as bumps or conductive pillars, is formed over the substrate between the first semiconductor die. A second semiconductor die is mounted to the first semiconductor die. The second semiconductor die is electrically connected through the interconnect structure to the substrate and through the conductive vias to the first semiconductor die. An underfill material is deposited between the first semiconductor die and substrate. Discrete electronic components can be mounted to the substrate. A heat spreader or shielding layer is mounted over the first and second semiconductor die and substrate. Alternatively, an encapsulant is formed over the die and substrate and conductive vias or bumps are formed in the encapsulant electrically connected to the first die.

25 Claims, 16 Drawing Sheets

(51) Int. Cl.
*H01L 25/065* (2006.01)
*H01L 23/31* (2006.01)
*H01L 23/36* (2006.01)
*H01L 23/48* (2006.01)
*H01L 23/552* (2006.01)
*H01L 23/00* (2006.01)
*H01L 25/00* (2006.01)

(52) U.S. Cl.
CPC .......... *H01L 2224/05644* (2013.01); *H01L 2224/05647* (2013.01); *H01L 2224/05655* (2013.01); *H01L 2224/06181* (2013.01); *H01L 2224/1132* (2013.01); *H01L 2224/1145* (2013.01); *H01L 2224/11334* (2013.01); *H01L 2224/11462* (2013.01); *H01L 2224/11464* (2013.01); *H01L 2224/11849* (2013.01); *H01L 2224/11901* (2013.01); *H01L 2224/13025* (2013.01); *H01L 2224/13111* (2013.01); *H01L 2224/13113* (2013.01); *H01L 2224/13116* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/1403* (2013.01); *H01L 2224/14051* (2013.01); *H01L 2224/14136* (2013.01); *H01L 2224/16145* (2013.01); *H01L 2224/16146* (2013.01); *H01L 2224/16225* (2013.01); *H01L 2224/16227* (2013.01); *H01L 2224/17051* (2013.01); *H01L 2224/32145* (2013.01); *H01L 2224/32245* (2013.01); *H01L 2224/48091* (2013.01); *H01L 2224/48227* (2013.01); *H01L 2224/73204* (2013.01); *H01L 2224/73253* (2013.01); *H01L 2224/73265* (2013.01); *H01L 2224/81191* (2013.01); *H01L 2224/93* (2013.01); *H01L 2224/97* (2013.01); *H01L 2225/06513* (2013.01); *H01L 2225/06541* (2013.01); *H01L 2225/06568* (2013.01); *H01L 2924/00014* (2013.01); *H01L 2924/014* (2013.01); *H01L 2924/01006* (2013.01); *H01L 2924/01029* (2013.01); *H01L 2924/01047* (2013.01); *H01L 2924/01073* (2013.01); *H01L 2924/01074* (2013.01); *H01L 2924/01079* (2013.01); *H01L 2924/01322* (2013.01); *H01L 2924/12041* (2013.01); *H01L 2924/12042* (2013.01); *H01L 2924/1306* (2013.01); *H01L 2924/13091* (2013.01); *H01L 2924/15311* (2013.01); *H01L 2924/181* (2013.01); *H01L 2924/18161* (2013.01); *H01L 2924/19104* (2013.01); *H01L 2924/19105* (2013.01); *H01L 2924/3011* (2013.01); *H01L 2924/3025* (2013.01)

(56) References Cited

U.S. PATENT DOCUMENTS

| | | | | |
|---|---|---|---|---|
| 7,002,805 | B2* | 2/2006 | Lee | H01L 25/105 257/706 |
| 7,012,323 | B2* | 3/2006 | Warner et al. | 257/676 |
| 7,122,906 | B2 | 10/2006 | Doan | |
| 7,982,298 | B1* | 7/2011 | Kang | H01L 25/03 257/621 |
| 8,395,269 | B2* | 3/2013 | Kawano et al. | 257/778 |
| 2004/0065963 | A1* | 4/2004 | Karnezos | 257/777 |
| 2004/0119166 | A1* | 6/2004 | Sunohara | H01L 21/304 257/758 |
| 2004/0178510 | A1* | 9/2004 | Sunohara et al. | 257/781 |
| 2007/0126085 | A1* | 6/2007 | Kawano et al. | 257/621 |
| 2008/0308950 | A1* | 12/2008 | Yoo | H01L 25/105 257/778 |
| 2010/0144091 | A1* | 6/2010 | Kawano et al. | 438/107 |

* cited by examiner

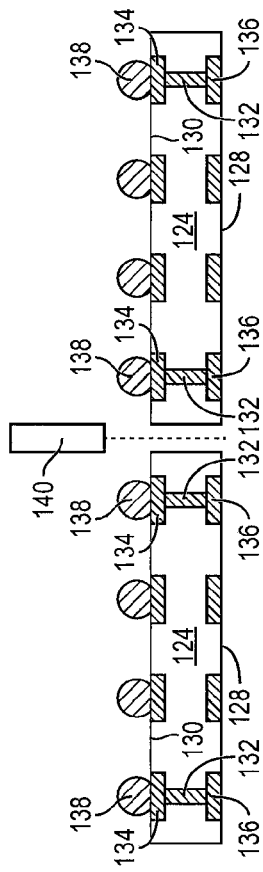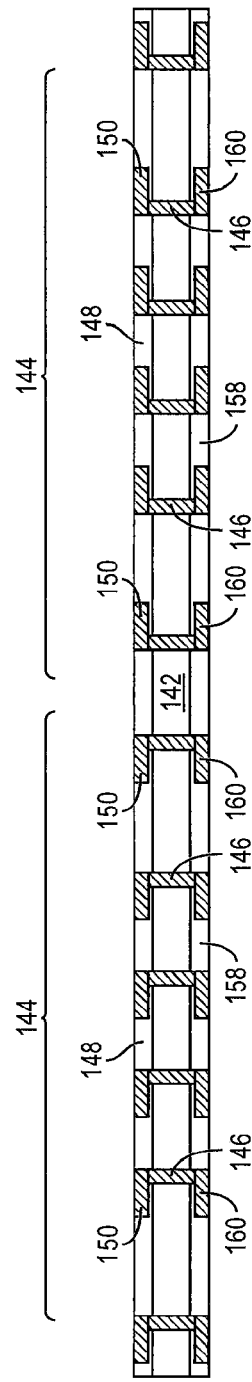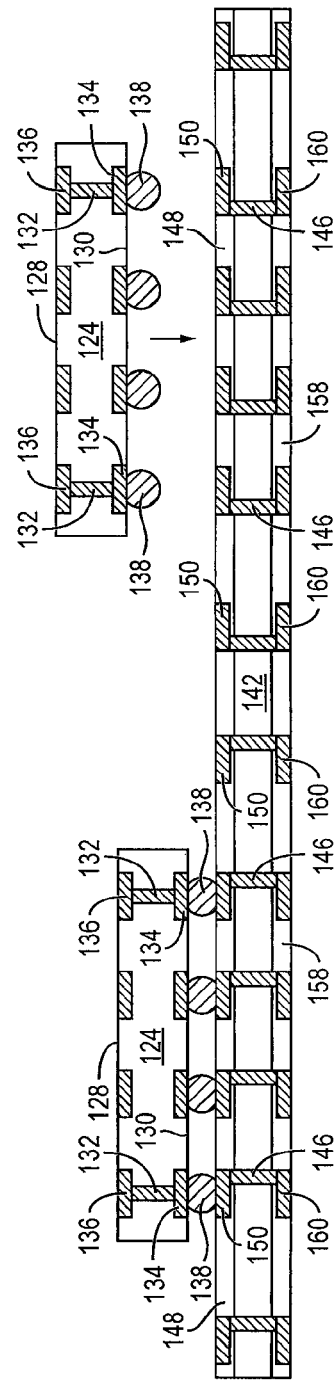
FIG. 3c
FIG. 4a
FIG. 4b

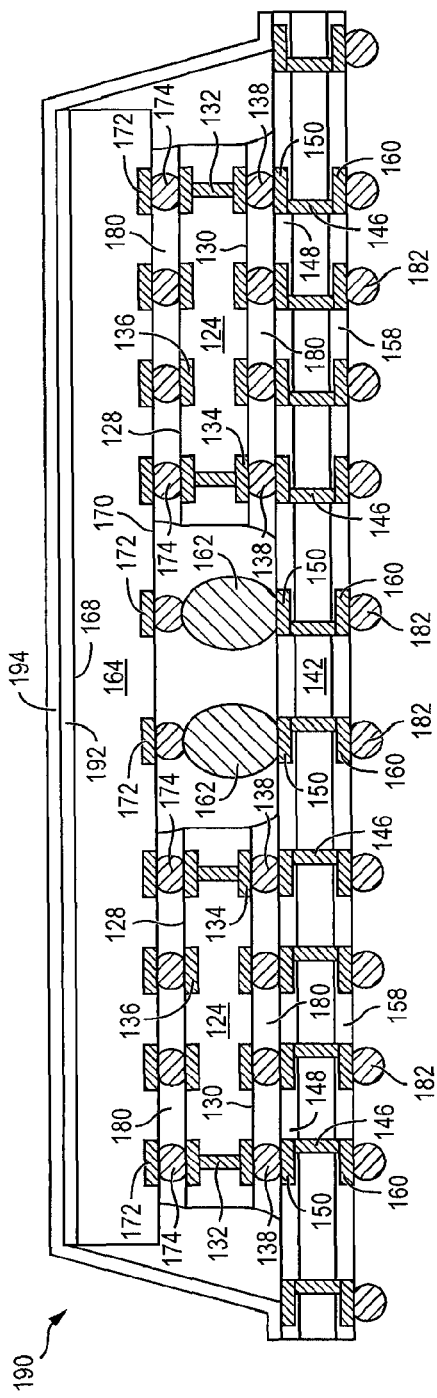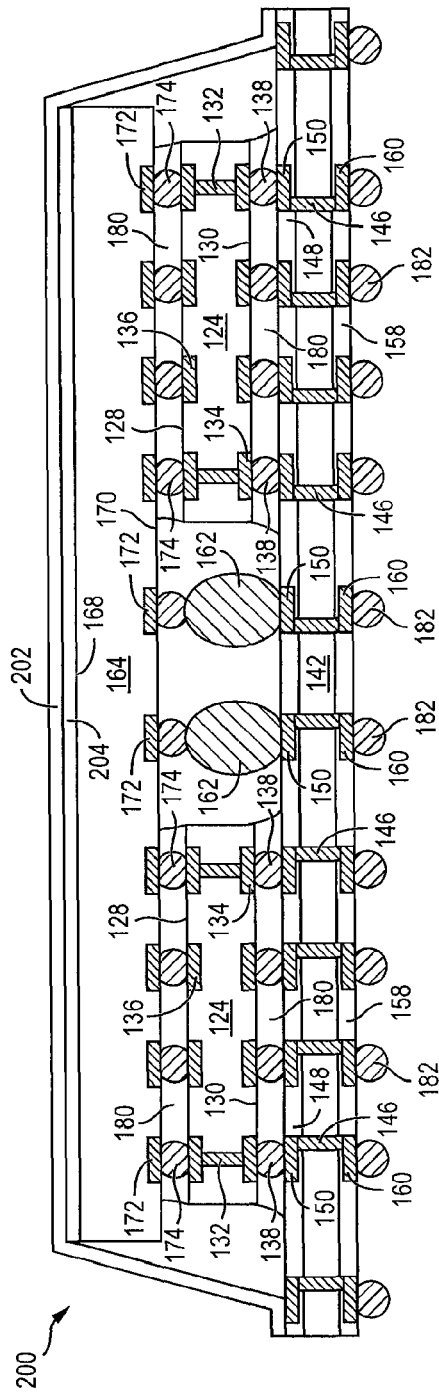
*FIG. 5*
*FIG. 6*

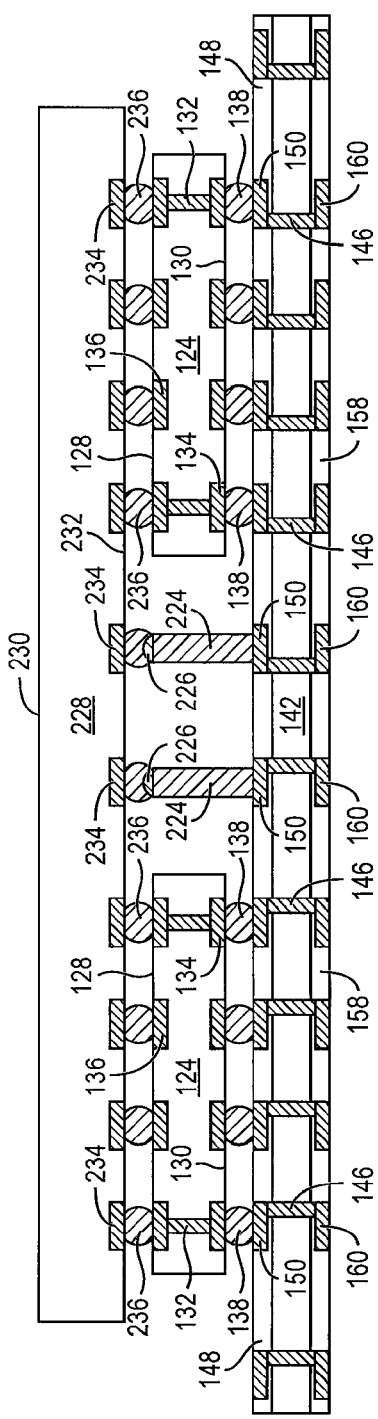

SEMICONDUCTOR DEVICE AND METHOD OF FORMING 3D SEMICONDUCTOR PACKAGE WITH SEMICONDUCTOR DIE STACKED OVER SEMICONDUCTOR WAFER

FIELD OF THE INVENTION

The present invention relates in general to semiconductor devices and, more particularly, to a semiconductor device and method of forming a 3D semiconductor package with semiconductor die stacked over a semiconductor wafer and vertical electrical interconnect structure covered by heat spreader or shielding layer.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

Some semiconductor packages incorporate a high degree of integration and functionality within the package. For example, the semiconductor package may contain a graphics processing unit (GPU), digital signal processor (DSP), memory, interface circuits, and signal processing circuits. The semiconductor package must be scaled to a larger size to house all the electronic components. The large size semiconductor package creates interconnect issues, for example in terms of bump wettability, deposition of underfill material, and general bump reliability. In addition, the electronic components within the high integration semiconductor package generate significant thermal energy, particularly from high frequency semiconductor devices such as the GPU and DSP. Without effective heat dissipation, the generated heat can reduce performance, decrease reliability, and reduce the useful lifetime of the semiconductor device.

SUMMARY OF THE INVENTION

A need exists for a high integration semiconductor package with effective thermal dissipation. Accordingly, in one embodiment, the present invention is a method of making a semiconductor device comprising the steps of providing a substrate with conductive traces, providing a plurality of first semiconductor die having conductive vias formed through the first semiconductor die, mounting the plurality of first semiconductor die with an active surface oriented toward the substrate, forming an interconnect structure over the conductive traces in the substrate between the first semiconductor die, mounting a second semiconductor die to the first semiconductor die, and mounting a heat spreader or shielding layer over the first and second semiconductor die and substrate. The second semiconductor die is electrically connected through the interconnect structure to the substrate and through the conductive vias to the first semiconductor die.

In another embodiment, the present invention is a method of making a semiconductor device comprising the steps of providing a substrate, providing a plurality of first semiconductor die having conductive vias formed through the first semiconductor die, mounting the plurality of first semiconductor die with an active surface oriented toward the substrate, forming an interconnect structure over the substrate between the first semiconductor die, and mounting a second semiconductor die to the first semiconductor die. The second semiconductor die is electrically connected through the interconnect structure to the substrate and through the conductive vias to the first semiconductor die.

In another embodiment, the present invention is a method of making a semiconductor device comprising the steps of providing a substrate, providing a plurality of first semiconductor die, mounting the plurality of first semiconductor die to the substrate, forming an interconnect structure over the substrate between the first semiconductor die, and mounting a second semiconductor die to the first semiconductor die. The second semiconductor die is electrically connected through the interconnect structure to the substrate.

In another embodiment, the present invention is a semiconductor device comprising a substrate and plurality of first semiconductor mounted to the substrate. An interconnect structure is formed over the substrate between the first semiconductor die. A second semiconductor die is mounted to the first semiconductor die. The second semiconductor die is electrically connected through the interconnect structure to the substrate.

BRIEF DESCRIPTION OF THE DRAWINGS

FIGS. 3a-3c illustrate a semiconductor wafer with a plurality of semiconductor die separated by saw streets;

FIGS. 4a-4h illustrate a process of forming a 3D semiconductor package with semiconductor die stacked over a semiconductor wafer and vertical interconnect structure;

FIG. 5 illustrates the 3D semiconductor package with a heat spreader;

FIG. 6 illustrates the 3D semiconductor package with a shielding layer;

FIG. 9a-9h illustrate a process of forming a 3D semiconductor package with vertical interconnect conductive pillars between the semiconductor die;

DETAILED DESCRIPTION OF THE DRAWINGS

Figure 1:
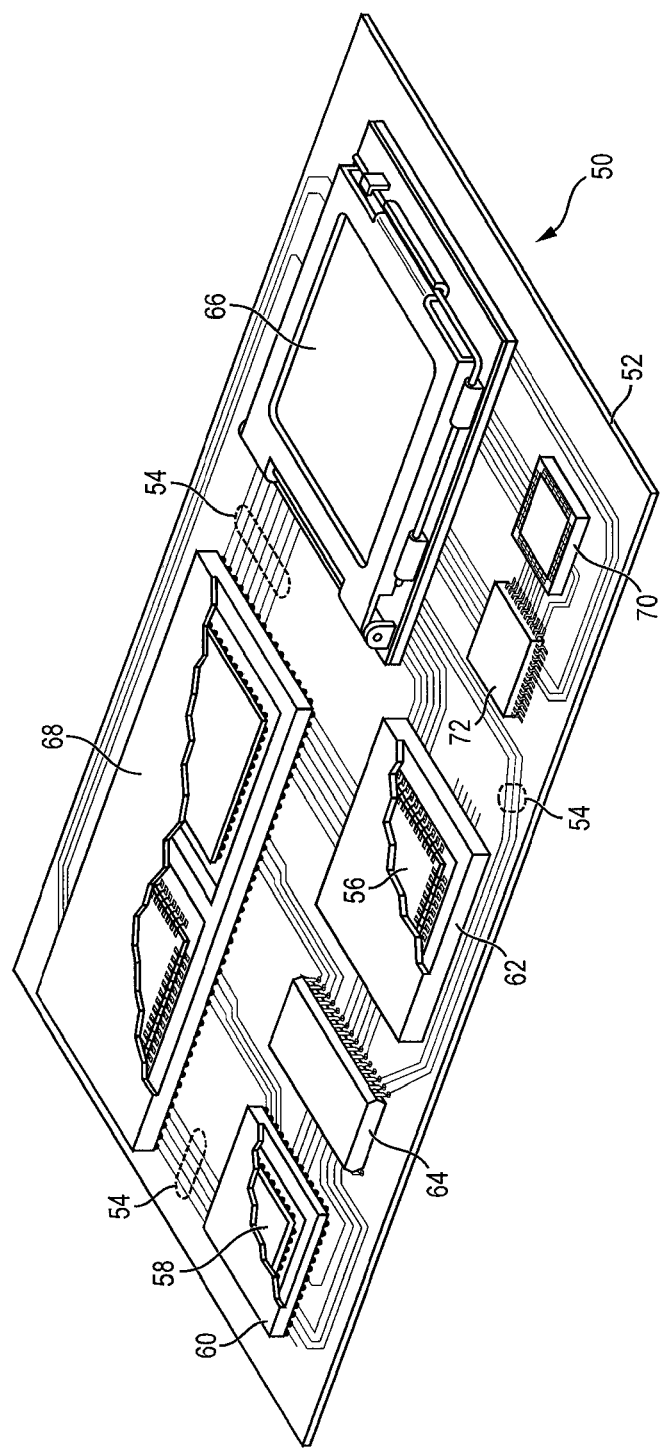
FIG. 1 illustrates a PCB with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a sub-component of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
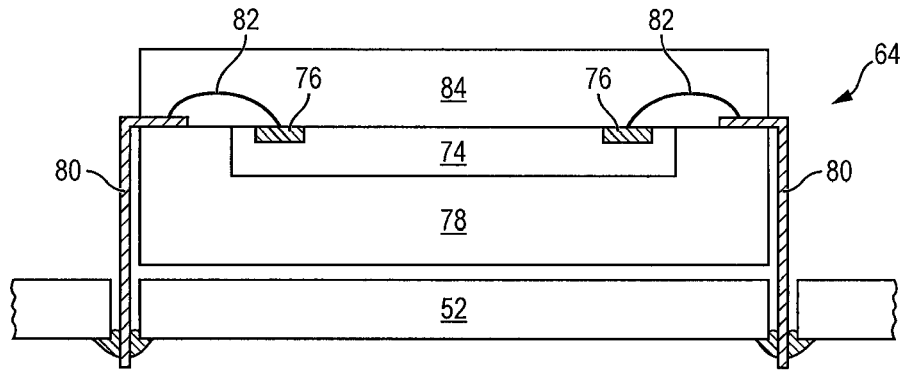
FIGS. 2a-2c illustrate further detail of the representative semiconductor packages mounted to the PCB.
Figure 2B:
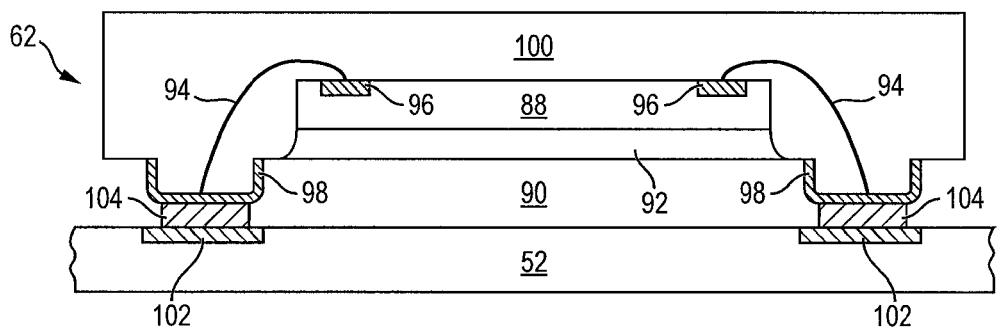
Figure 2C:
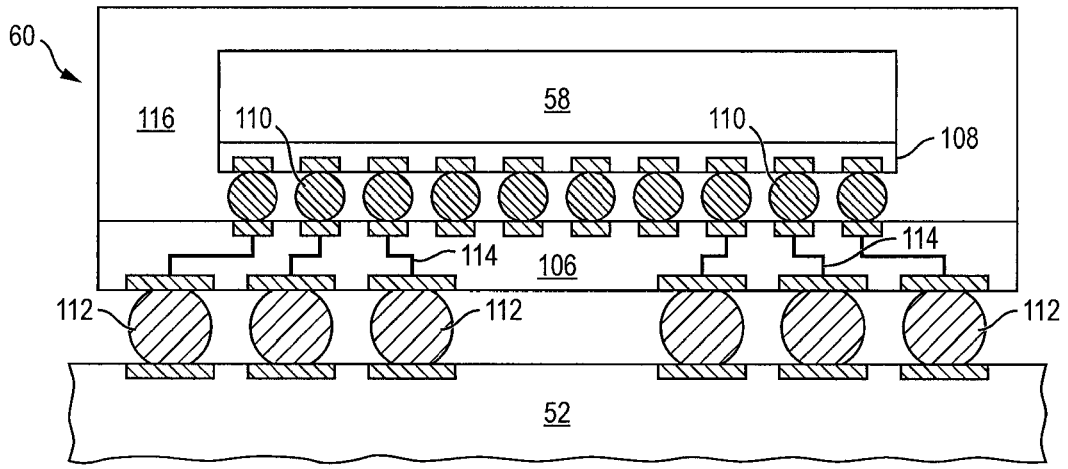

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 3A:
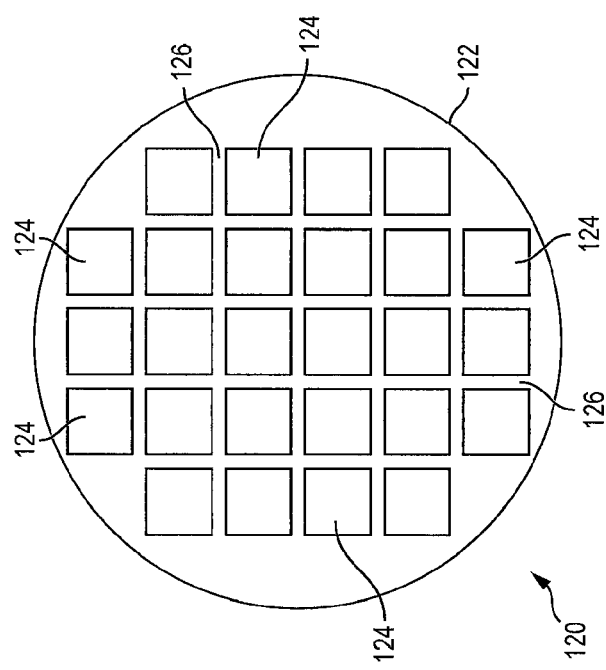

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124.

Figure 3B:
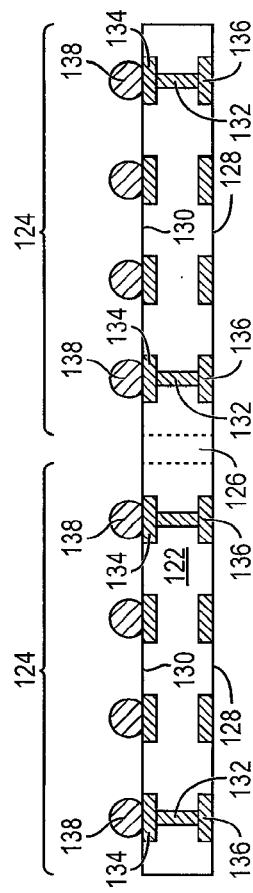

FIG. 3b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as DSP, ASIC, memory, or other signal processing circuit. Semiconductor die 124 may also contain integrated passive devices (IPDs), such as inductors, capacitors, and resistors, for RF signal processing. In one embodiment, semiconductor die 124 is a flipchip type die.

A plurality of vias is formed into active surface 130 and through semiconductor wafer 120 using mechanical drilling, laser drilling, or deep reactive ion etching (DRIE). The vias are filled with Al, Cu, Sn, Ni, Au, Ag, titanium (Ti), tungsten (W), poly-silicon, or other suitable electrically conductive material using electrolytic plating, electroless plating process, or other suitable metal deposition process to form z-direction conductive through silicon vias (TSV) 132 embedded within semiconductor die 124.

An electrically conductive layer 134 is formed over active surface 130 using PVD, CVD, electrolytic plating, electroless plating process, or other suitable metal deposition process. An electrically conductive layer 136 is formed over back surface 128 using PVD, CVD, electrolytic plating, electroless plating process, or other suitable metal deposition process. Conductive layers 134 and 136 can be one or more layers of Al, Cu, Sn, Ni, Au, Ag, or other suitable electrically conductive material. Conductive layers 134 and 136 are electrically connected to conductive TSVs 132. Conductive layer 134 operates as contact pads electrically connected to the circuits on active surface 130. Conductive layer 136 operates as contact pads and redistribution layer (RDL) for external electrical interconnect on back surface 128 of semiconductor die 124. Contact pads 134 and 136 can be disposed side-by-side a first distance from the edge of semiconductor die 124, as shown in FIG. 3b. Alternatively, contact pads 134 and 136 can be offset in multiple rows such that a first row of contact pads is disposed a first distance from the edge of the die, and a second row of contact pads alternating with the first row is disposed a second distance from the edge of the die.

An electrically conductive bump material is deposited over contact pads 134 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to contact pads 134 using a suitable attachment or bonding process. In one embodiment, the bump material is reflowed by heating the material above its melting point to form balls or bumps 138. In some applications, bumps 138 are reflowed a second time to improve electrical contact to contact pads 134. Bumps 138 can also be compression bonded to contact pads 134. Bumps 138 represent one type of interconnect structure that can be formed over contact pads 134. The interconnect structure can also be stud bumps, micro bumps, or other electrical interconnect.

In FIG. 3c, semiconductor wafer 120 is singulated through saw street 126 using a saw blade or laser cutting tool 140 into individual TSV semiconductor die 124.

Figure 4C:
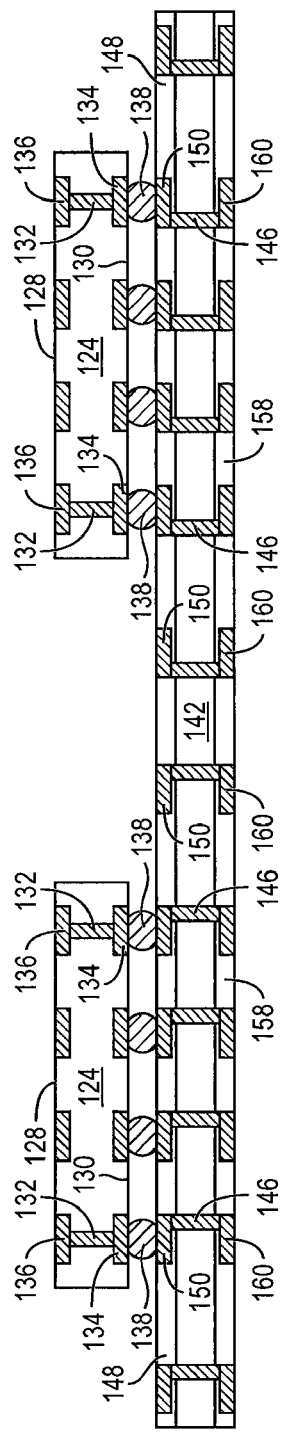

FIGS. 4a-4h illustrate, in relation to FIGS. 1 and 2a-2c, a process of forming a 3D semiconductor package with semiconductor die stacked over a semiconductor wafer and vertical electrical interconnect structure. FIG. 4a shows a portion of semiconductor wafer or substrate 142 contains a base material, such as silicon, germanium, gallium arsenide, indium phosphide, or silicon carbide, for structural support, similar to FIG. 3a. Semiconductor wafer 142 contains embedded semiconductor die or components 144 separated by a saw street, as discussed above. In one embodiment, semiconductor die 144 contain memory devices.

A plurality of vias is formed through semiconductor wafer 142 using laser drilling, mechanical drilling, or DRIE. The vias are filled with Al, Cu, Sn, Ni, Au, Ag, Ti, W, poly-silicon, or other suitable electrically conductive material using electrolytic plating, electroless plating process, or other suitable metal deposition process to form z-direction vertical interconnect conductive vias 146.

An insulating or passivation layer 148 is formed over a first surface of semiconductor wafer 142 and conductive vias 146 using PVD, CVD, printing, spin coating, spray coating, sintering or thermal oxidation. The insulating layer 148 contains one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. A portion of insulating layer 148 is removed by an etching process to expose semiconductor wafer 142 and conductive vias 146.

An electrically conductive layer or RDL 150 is formed over the exposed substrate 142 and conductive vias 146 using a patterning and metal deposition process such as printing, PVD, CVD, sputtering, electrolytic plating, and electroless plating. Conductive layer 150 can be one or more layers of Al, Cu, Sn, Ni, Au, Ag, or other suitable electrically conductive material. Conductive layer 150 is electrically connected to conductive vias 146.

An insulating or passivation layer 158 is formed over a second opposing surface of semiconductor wafer 142 and conductive vias 146 using PVD, CVD, printing, spin coating, spray coating, sintering or thermal oxidation. The insulating layer 158 contains one or more layers of SiO2, Si3N4, SiON, Ta2O5, Al2O3, or other material having similar insulating and structural properties. A portion of insulating layer 158 is removed by an etching process to expose substrate 142 and conductive vias 146.

An electrically conductive layer or RDL 160 is formed over the exposed substrate 142 and conductive vias 146 using a patterning and metal deposition process such as printing, PVD, CVD, sputtering, electrolytic plating, and electroless plating. Conductive layer 160 can be one or more layers of Al, Cu, Sn, Ni, Au, Ag, or other suitable electrically conductive material. Conductive layer 160 is electrically connected to conductive vias 146. In another embodiment, conductive vias 146 are formed through substrate 142 after forming conductive layers 150 and/or 160.

In FIG. 4b, TSV semiconductor die 124 from FIGS. 3a-3c are mounted to semiconductor wafer 142 using a pick and place operation with active surface 130 oriented toward the wafer. FIG. 4c shows TSV semiconductor die 124 mounted to semiconductor wafer 142 with bumps 138 electrically connected to conductive layer 150. In one embodiment, TSV semiconductor die 124 are mounted to respective semiconductor die 144 of semiconductor wafer 142.

Figure 4D:
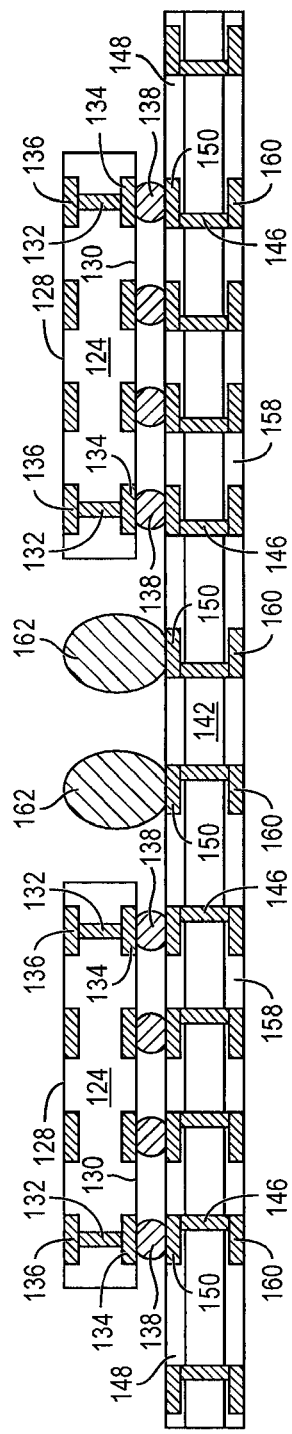

In FIG. 4d, an electrically conductive bump material is deposited over a portion of conductive layer 150 between semiconductor die 124 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 150 using a suitable attachment or bonding process. In one embodiment, the bump material is reflowed by heating the material above its melting point to form balls or bumps 162. In some applications, bumps 162 are reflowed a second time to improve electrical contact to conductive layer 150. Bumps 162 can also be compression bonded to conductive layer 150. Bumps 162 extend to a height approximately even with back surface 128 of semiconductor die 124, e.g., the bumps have a height of 100-200 micrometers (μm). Bumps 162 represent one type of interconnect structure that can be formed over conductive layer 150. The interconnect structure can also be conductive pillars, stud bumps, micro bumps, or other electrical interconnect.

Figure 4E:
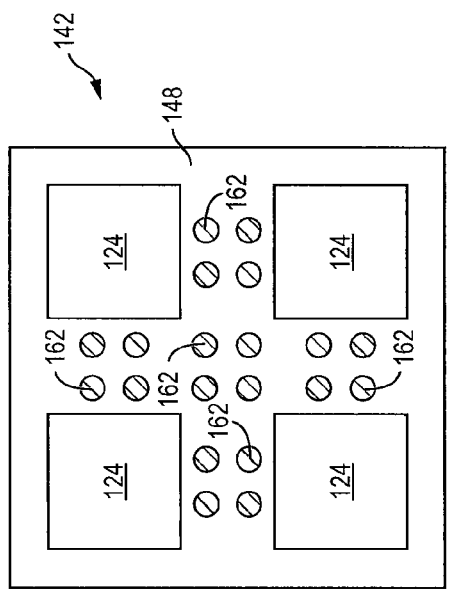

FIG. 4e shows a top view of a plurality of semiconductor die 124 mounted to respective semiconductor die 144 of semiconductor wafer 142. Bumps 162 are formed over semiconductor wafer 142 around semiconductor die 124.

Figure 4F:
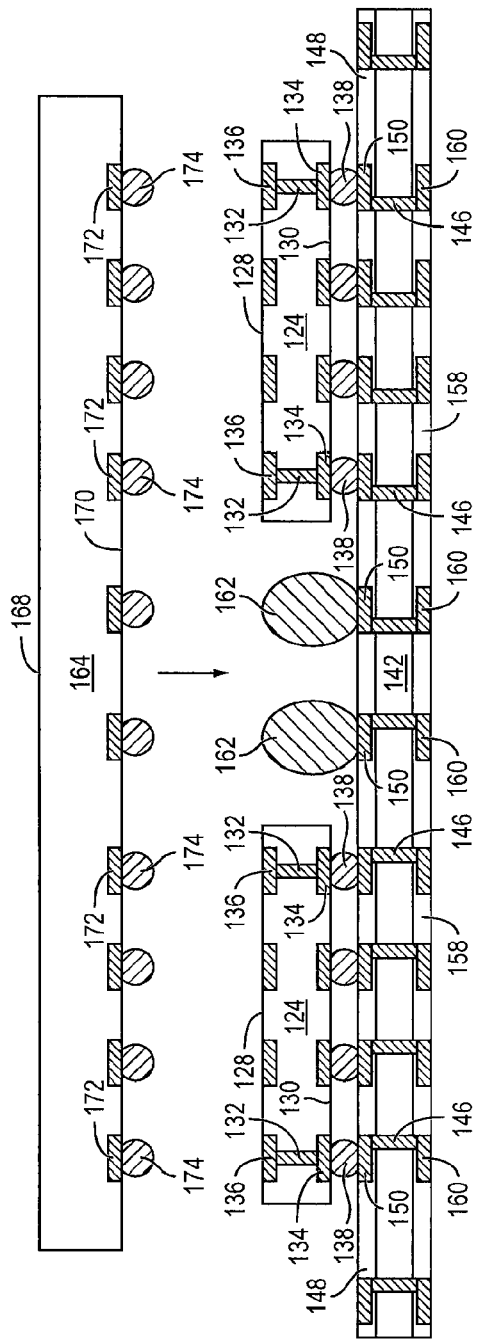

FIG. 4f shows a semiconductor die 164 originating from a semiconductor wafer, similar to FIG. 3a. Semiconductor die 164 has a back surface 168 and active surface 170 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 170 to implement analog circuits or digital circuits, such as GPU, DSP, ASIC, memory, or other signal processing circuit. Semiconductor die 164 may also contain IPDs, such as inductors, capacitors, and resistors, for RF signal processing. A plurality of contact pads 172 is formed on active surface 170 and electrically connected to the circuits on the active surface. A plurality of bumps 174 is formed over contact pads 172. In one embodiment, semiconductor die 164 is a flipchip type die containing a GPU.

Figure 4G:
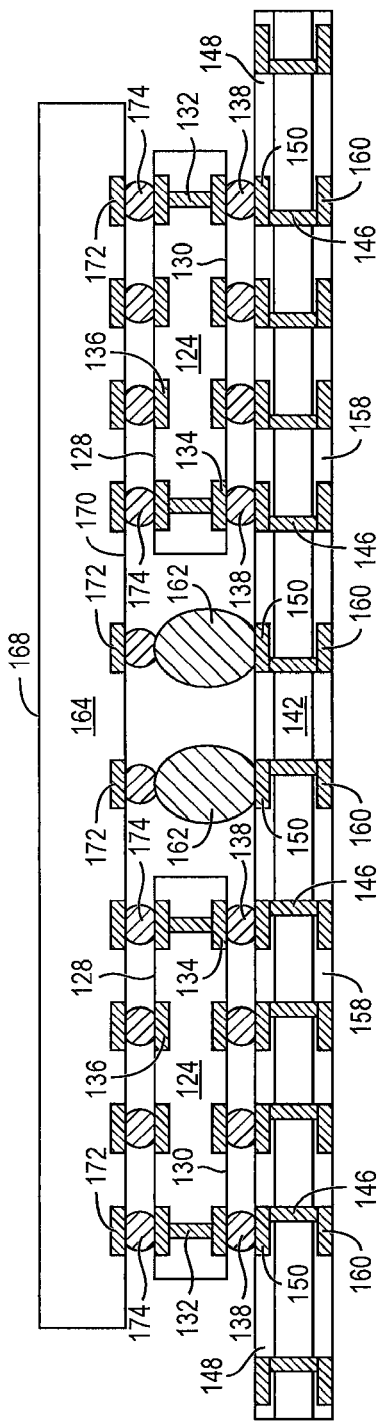

Semiconductor die 164 is mounted to semiconductor die 124 and bumps 162 using a pick and place operation with active surface 170 oriented toward the semiconductor die and bumps. FIG. 4g shows semiconductor die 164 mounted to semiconductor die 124 with bumps 174 electrically connected to bumps 162 and conductive layer 136.

Figure 4H:
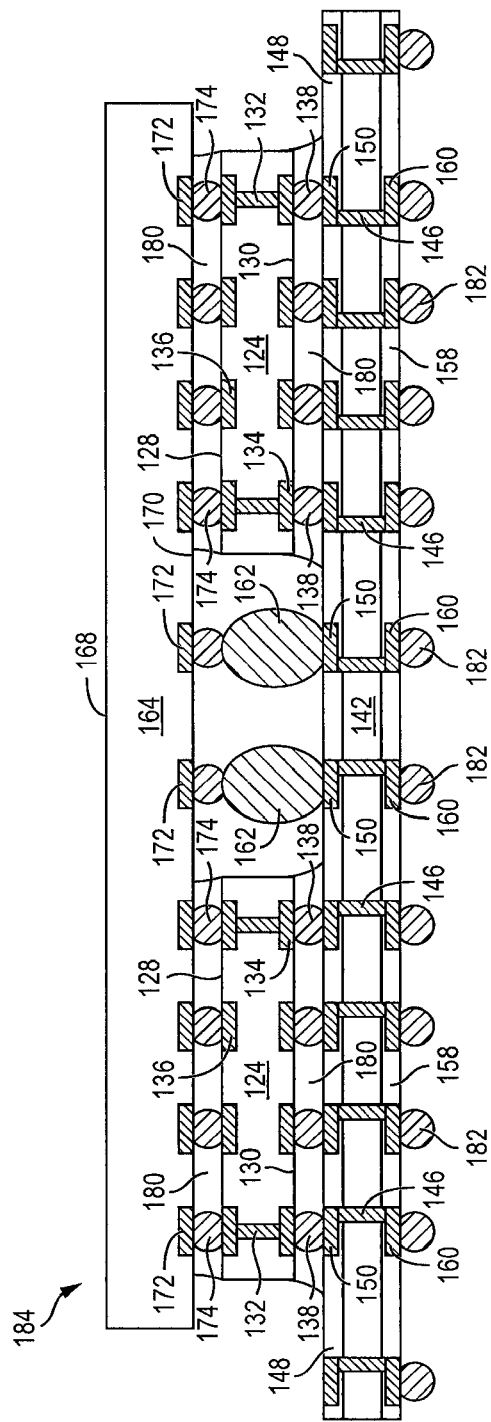

In FIG. 4h, an underfill material 180 is deposited between semiconductor die 124 and 164 and between semiconductor die 124 and insulating layer 148 of semiconductor wafer 142. The underfill material 180 can be epoxy, epoxy-resin adhesive material, polymeric materials, films, or other non-conductive materials. The underfill material 180 is deposited around bumps 138 and 174, and fills an area between active surface 170 of semiconductor die 164 and back surface 128 of semiconductor die 124 and between active surface 130 of semiconductor die 124 and insulating layer 148. The underfill material 180 may contact sidewalls of semiconductor die 124 and 164 to strengthen a connection between the semiconductor die.

Alternatively, a mold underfill (MUF) material is deposited between semiconductor die 124 and 164 and between semiconductor die 124 and insulating layer 148 of semiconductor wafer 142. MUF includes polymer composite material, such as epoxy resin with filler, epoxy acrylate with filler, or polymer with proper filler. MUF can be pumped from a reservoir to a dispensing needle. MUF is injected under pressure from the dispensing needle between semiconductor die 124 and 164 and around bumps 138 and 174. A vacuum assist can draw the MUF to aid with uniform distribution. MUF is non-conductive and environmentally protects the semiconductor device from external elements and contaminants.

An electrically conductive bump material is deposited over conductive layer 160 of semiconductor wafer 142 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 160 using a suitable attachment or bonding process. In one embodiment, the bump material is reflowed by heating the material above its melting point to form balls or bumps 182. In some applications, bumps 182 are reflowed a second time to improve electrical contact to conductive layer 160. Bumps 182 can also be compression bonded to conductive layer 160. Bumps 182 represent one type of interconnect structure that can be formed over conductive layer 160. The interconnect structure can also be stud bumps, micro bumps, or other electrical interconnect.

Semiconductor wafer 142 is electrically connected through conductive layers 150 and 160, conductive vias 146, and bumps 138 to semiconductor die 124. Likewise, semiconductor die 124 is electrically connected through conductive layers 134 and 136, conductive TSVs 132, and bumps 174 to semiconductor die 164. Bumps 162 and 174 provide a direct electrical connection between semiconductor wafer 142 and semiconductor die 164. In one embodiment, memory circuits in semiconductor die 144 of semiconductor wafer 142 are efficiently connected to interface circuits and signal processing circuits in semiconductor die 124 and GPU in semiconductor die 164, all within a 3D stacked-die semiconductor package 184. By stacking semiconductor die 124 and 164 over semiconductor wafer 142, semiconductor package 184 achieves a high degree of integration.

FIG. 5 shows an embodiment of 3D stacked-die semiconductor package 190, similar to FIG. 4h, with a TIM 192 deposited over back surface 168 of semiconductor die 164. TIM 192 is a thermal epoxy, thermal epoxy resin, or thermal conductive paste. Heat spreader or heat sink 194 is positioned over and mounted to TIM 192 over semiconductor die 164 and conductive layer 150 of semiconductor wafer 142. Heat spreader 194 can be Cu, Al, or other material with high thermal conductivity. Heat spreader 194 and TIM 192 form a thermally conductive path that distributes and dissipates the heat generated by the high frequency electronic components of semiconductor die 124 and 164 and increases the thermal performance of semiconductor package 190. The heat is dissipated radially from heat spreader 194 and through conductive layers 150 and 160, conductive vias 146, and bumps 182 to an external substrate or chassis.

Semiconductor wafer 142 is electrically connected through conductive layers 150 and 160, conductive vias 146, and bumps 138 to semiconductor die 124. Likewise, semiconductor die 124 is electrically connected through conductive layers 134 and 136, conductive TSVs 132, and bumps 174 to semiconductor die 164. Bumps 162 and 174 provide a direct electrical connection between semiconductor wafer 142 and semiconductor die 164. In one embodiment, memory circuits in semiconductor die 144 of semiconductor wafer 142 are efficiently connected to interface circuits and signal processing circuits in semiconductor die 124 and GPU in semiconductor die 164, all within a 3D stacked-die semiconductor package 190. The high frequency components of semiconductor die 124 and 164 generate significant thermal energy. By stacking semiconductor die 124 and 164 over semiconductor wafer 142, semiconductor package 190 achieves a high degree of integration while providing effective heat dissipation through heat spreader 184 and TIM 182 for high thermal components such as the GPU in semiconductor die 164.

FIG. 6 shows an embodiment of semiconductor package 200, similar to FIG. 4h, with an EMI and RFI shielding layer 202 formed over semiconductor die 124 and 164 and semiconductor wafer 142. Semiconductor die 124 and 164 may contain baseband circuits that generate EMI, RFI, or other inter-device interference, such as capacitive, inductive, or conductive coupling. In other embodiments, semiconductor die 124 and 164 contain IPDs that are susceptible to EMI, RFI, and inter-device interference. For example, the IPDs contained within semiconductor die 124 and 164 provide the electrical characteristics needed for high frequency applications, such as resonators, high-pass filters, low-pass filters, band-pass filters, symmetric Hi-Q resonant transformers, and tuning capacitors. The IPDs can be used as front-end wireless RF components, which can be positioned between the antenna and transceiver. The IPD inductor can be a hi-Q balun, transformer, or coil, operating up to 100 Gigahertz. In some applications, multiple baluns are formed on a same substrate, allowing multi-band operation. For example, two or more baluns are used in a quad-band for mobile phones or other global system for mobile (GSM) communications, each balun is dedicated for a frequency band of operation of the quad-band device. A typical RF system requires multiple IPDs and other high frequency circuits in one or more semiconductor packages to perform the necessary electrical functions.

To reduce the effects of EMI and RFI, a shielding layer 202 positioned over and mounted over semiconductor die 124 and 164 and semiconductor wafer 142 with an adhesive layer 204. Shielding layer 202 can be one or more layers of Al, Cu, ferrite or carbonyl iron, stainless steel, nickel silver, low-carbon steel, silicon-iron steel, foil, conductive resin, conductive paste, and other metals and composites capable of blocking or absorbing EMI, RFI, and other inter-device interference. In another embodiment, shielding layer 202 can be a non-metal material such as carbon-black or aluminum flake to reduce the effects of EMI and RFI. Shielding layer 202 is grounded through conductive layers 150 and 160, conductive vias 146, and bumps 182 to an external low impedance ground point. The high frequency components of semiconductor die 124 and 164 generate or are susceptible to significant EMI and EFI. By stacking semiconductor die 124 and 164 over semiconductor wafer 142, semiconductor package 200 achieves a high degree of integration while reducing the effects of EMI and RFI with shielding layer 202.

Figure 7:
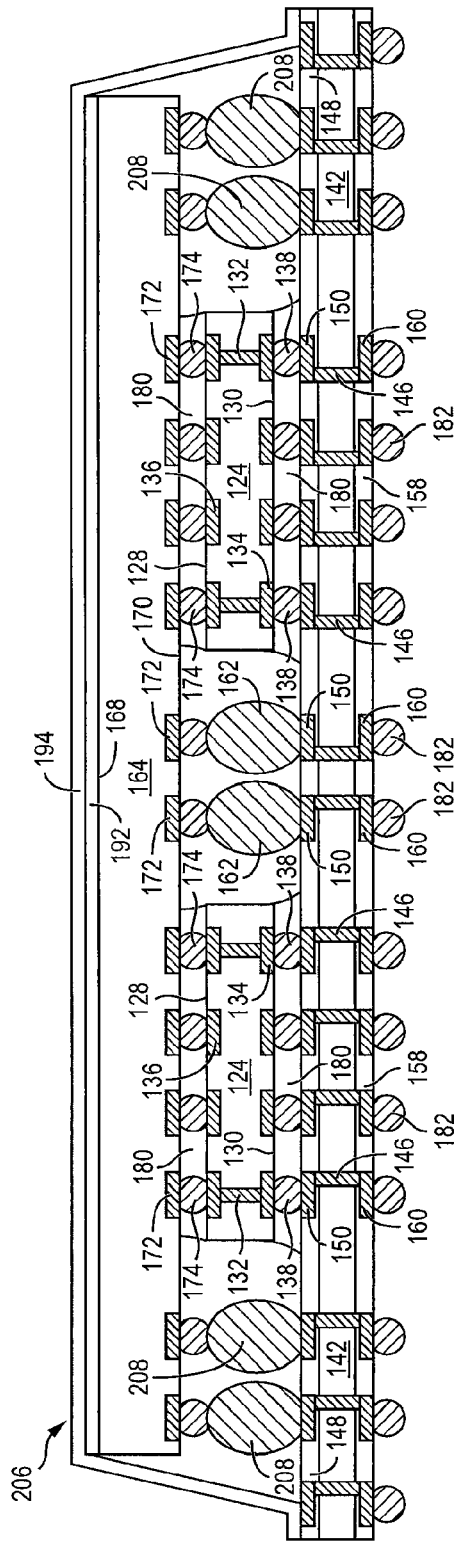
FIG. 7 illustrates the 3D semiconductor package with additional vertical interconnect bumps formed around the semiconductor die.

FIG. 7 shows an embodiment of semiconductor package 206, similar to FIG. 5, with bumps 208 formed over conductive layer 150 of semiconductor wafer 142 between semiconductor die 124 and heat spreader 194 for additional vertical electrical interconnect. Bumps 208 are similar to bumps 162, as described in FIG. 4d. Bumps 208 are electrically connected to conductive layer 150 and bumps 174 of semiconductor die 164.

Figure 8:
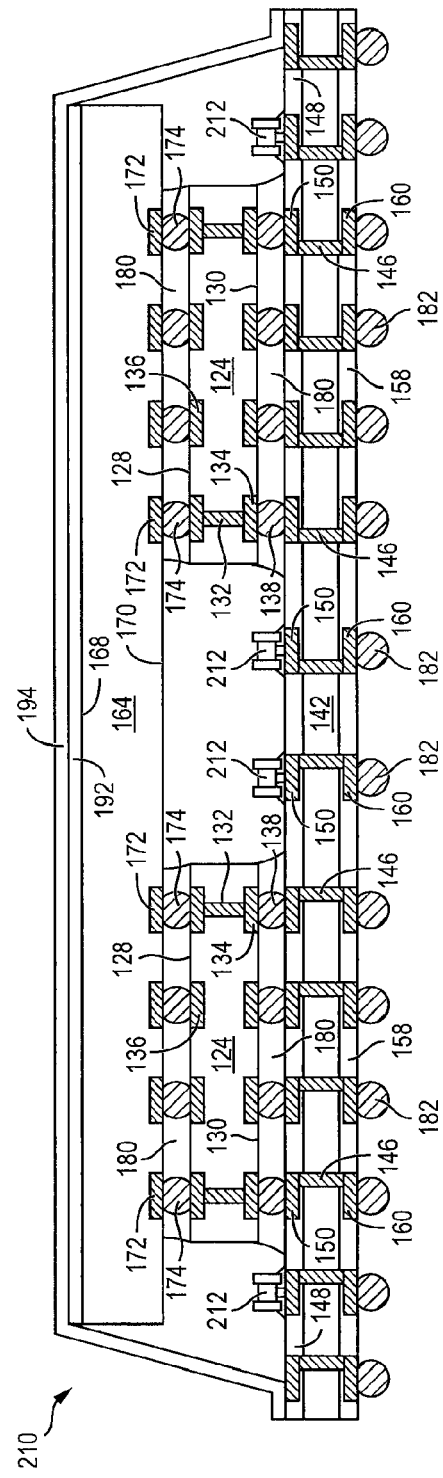
FIG. 8 illustrates the 3D semiconductor package with discrete passive and active devices mounted to the semiconductor wafer.

FIG. 8 shows an embodiment of semiconductor package 210, similar to FIG. 5, with discrete electronic components 212, e.g., discrete passive or active devices, formed over semiconductor wafer 142 around semiconductor die 124. The discrete electronic components 212 can be inductors, capacitors, resistors, transistors, and diodes. The discrete electronic components 212 are electrically connected to conductive layer 150 of semiconductor wafer 142. Bumps 162 are omitted from FIG. 8 for simplicity of presentation. Bumps 162 can be formed in semiconductor package 210 for additional vertical electrical interconnect between semiconductor wafer 142 and semiconductor die 164, as shown in FIGS. 5 and 7.

Figure 9A:
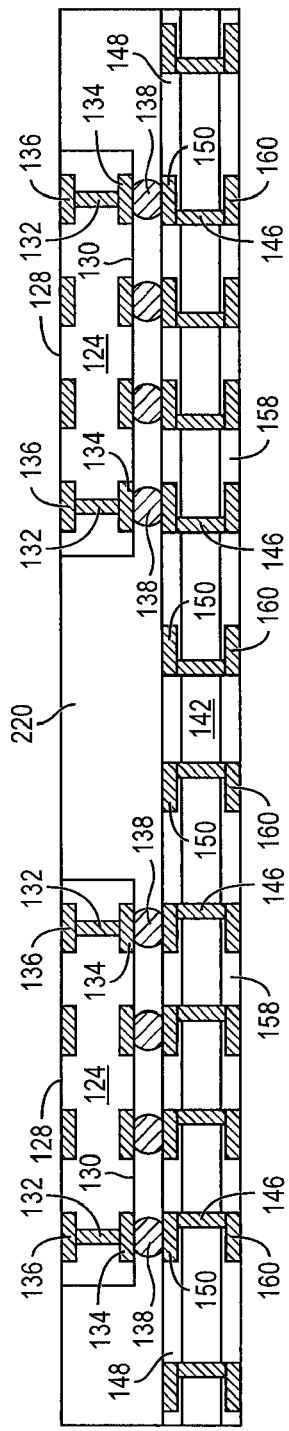

FIGS. 9a-9h illustrate, in relation to FIGS. 1 and 2a-2c, a process of forming a 3D semiconductor package with semiconductor die stacked over a semiconductor wafer and conductive pillars formed between the semiconductor die and semiconductor wafer. Continuing from FIG. 4c, a photosensitive insulating layer 220, such as solder resist, is formed over semiconductor die 124 and semiconductor wafer 142 using PVD, CVD, screen printing, spin coating, spray coating, sintering or thermal oxidation, as shown in FIG. 9a.

Figure 9B:
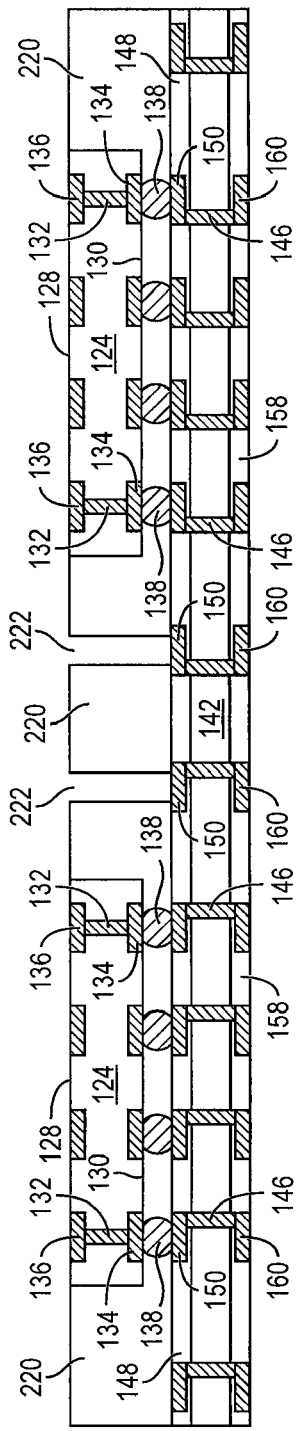
Figure 9C:
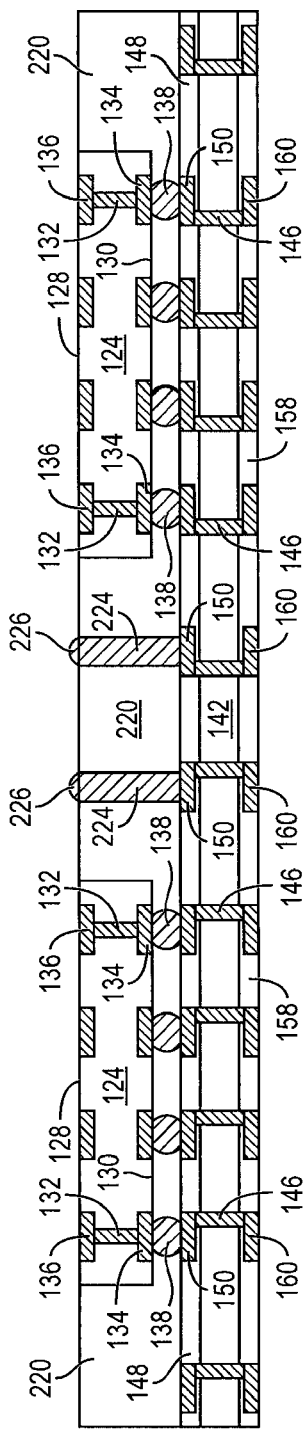

In FIG. 9b, a plurality of vias 222 is formed through insulating layer 222 between semiconductor die 124 using laser drilling, mechanic drilling, etching, or DRIE. In FIG. 9c, vias 222 are filled with Al, Cu, Sn, Ni, Au, Ag, Ti, W, poly-silicon, or other suitable electrically conductive material using electrolytic plating, electroless plating process, or other suitable metal deposition process to form z-direction vertical interconnect conductive pillars 224. Conductive pillars 224 are electrically connected to conductive layer 150 between semiconductor die 124.

An optional electrically conductive bump material 226 is deposited over conductive pillars 224 using an evaporation, electrolytic plating, electroless plating, ball drop, or screen printing process. The bump material 226 can be Al, Sn, Ni, Au, Ag, Pb, Bi, Cu, solder, and combinations thereof, with an optional flux solution. For example, the bump material 226 can be eutectic Sn/Pb, high-lead solder, or lead-free solder. In one embodiment, conductive bump material 226 is a solder cap.

Figure 9D:
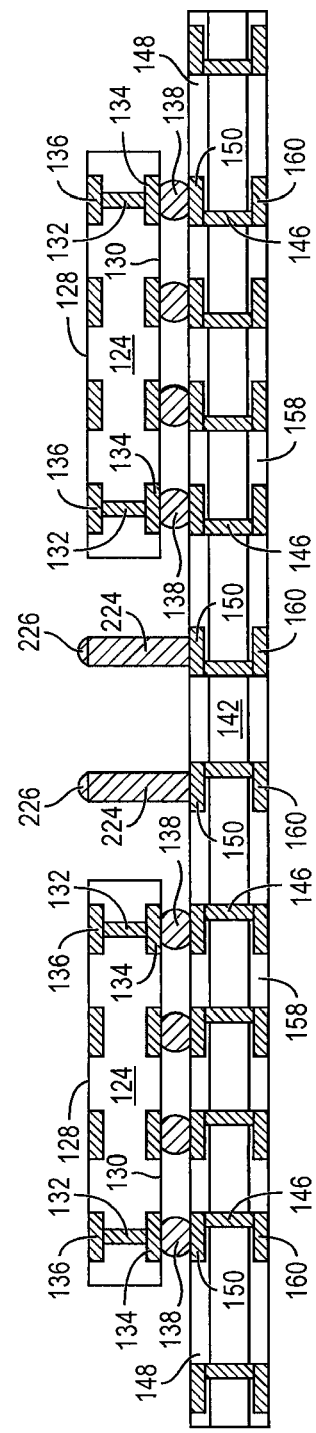

In FIG. 9d, insulating layer 200 is removed leaving conductive pillars 224 with bump material 226 disposed over conductive layer 150 of semiconductor wafer 142 between semiconductor die 124. A top surface of the conductive pillars is substantially coplanar with back surface 128 of semiconductor die 124 with bump material 226 extending above the back surface of the semiconductor die.

Figure 9E:
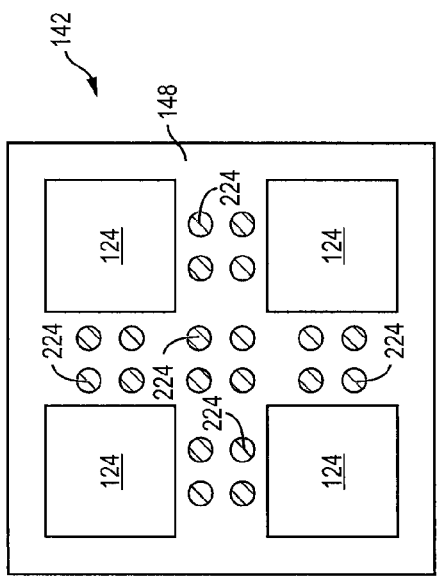

FIG. 9e shows a top view of a plurality of semiconductor die 124 mounted to semiconductor wafer 142 and conductive pillars 224 formed over the semiconductor wafer around the semiconductor die.

Figure 9F:
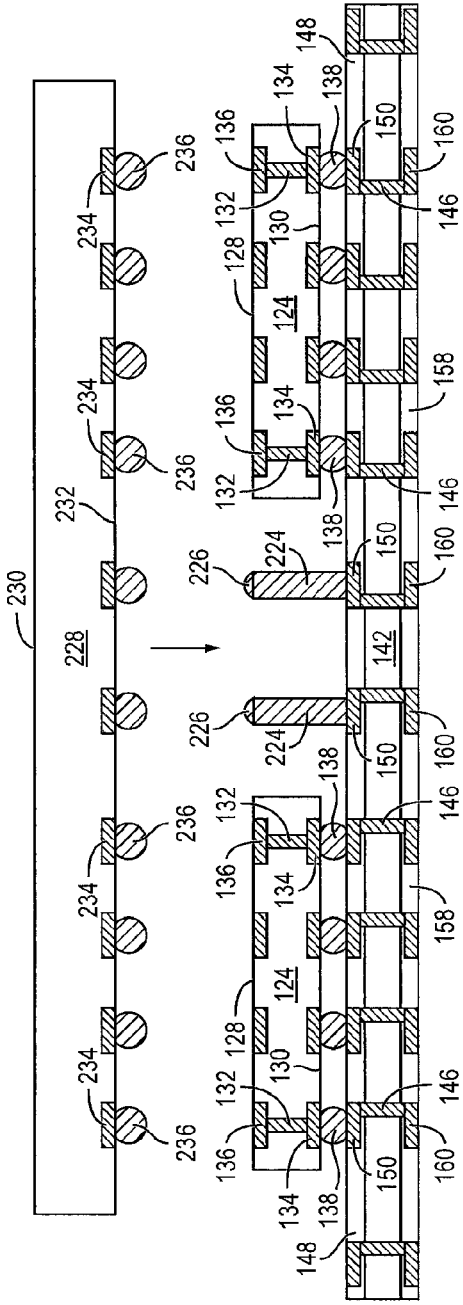

FIG. 9f shows a semiconductor die 228 originating from a semiconductor wafer, similar to FIG. 3a. Semiconductor die 228 has a back surface 230 and active surface 232 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 232 to implement analog circuits or digital circuits, such as GPU, DSP, ASIC, memory, or other signal processing circuit. Semiconductor die 228 may also contain IPDs, such as inductors, capacitors, and resistors, for RF signal processing. A plurality of contact pads 234 is formed on active surface 232 and electrically connected to the circuits on the active surface. A plurality of bumps 236 is formed over contact pads 234. In one embodiment, semiconductor die 228 is a flipchip type die containing a GPU.

Semiconductor die 228 is mounted to semiconductor die 124 and conductive pillars 224 using a pick and place operation with active surface 232 oriented toward the semiconductor die and conductive pillars. FIG. 9g shows semiconductor die 228 mounted to semiconductor die 124 with bumps 236 electrically connected to conductive layer 136 and conductive pillars 224.

In FIG. 9h, an underfill material 238 is deposited between semiconductor die 124 and 228 and between semiconductor die 124 and insulating layer 148 of semiconductor wafer 142. The underfill material 238 can be epoxy, epoxy-resin adhesive material, polymeric materials, films, or other non-conductive materials. The underfill material 238 is deposited around bumps 138 and 236, and fills an area between active surface 232 of semiconductor die 228 and back surface 128 of semiconductor die 124 and between active surface 130 of semiconductor die 124 and insulating layer 148. The underfill material 238 may contact sidewalls of semiconductor die 124 and 228 to strengthen a connection between the semiconductor die.

Alternatively, a MUF material is deposited between semiconductor die 124 and 228 and between semiconductor die 124 and insulating layer 148 of semiconductor wafer 142. MUF includes polymer composite material, such as epoxy resin with filler, epoxy acrylate with filler, or polymer with proper filler. MUF can be pumped from a reservoir to a dispensing needle. MUF is injected under pressure from the dispensing needle between semiconductor die 124 and 228 and around bumps 138 and 236. A vacuum assist can draw the MUF to aid with uniform distribution. MUF is non-conductive and environmentally protects the semiconductor device from external elements and contaminants.

An electrically conductive bump material is deposited over conductive layer 160 of semiconductor wafer 142 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 160 using a suitable attachment or bonding process. In one embodiment, the bump material is reflowed by heating the material above its melting point to form balls or bumps 240. In some applications, bumps 240 are reflowed a second time to improve electrical contact to conductive layer 160. Bumps 240 can also be compression bonded to conductive layer 160. Bumps 240 represent one type of interconnect structure that can be formed over conductive layer 160. The interconnect structure can also be stud bumps, micro bumps, or other electrical interconnect.

Semiconductor wafer 142 is electrically connected through conductive layers 150 and 160, conductive vias 146, and bumps 138 to semiconductor die 124. Likewise, semiconductor die 124 is electrically connected through conductive layers 134 and 136, conductive TSVs 132, and bumps 236 to semiconductor die 228. Conductive pillars 224 and bumps 236 provide a direct electrical connection between semiconductor wafer 142 and semiconductor die 228. In one embodiment, memory circuits in semiconductor die 144 of semiconductor wafer 142 are efficiently connected to interface circuits and signal processing circuits in semiconductor die 124 and GPU in semiconductor die 228, all within a 3D stacked-die semiconductor package 242. By stacking semiconductor die 124 and 228 over semiconductor wafer 142, semiconductor package 242 achieves a high degree of integration.

Figure 10:
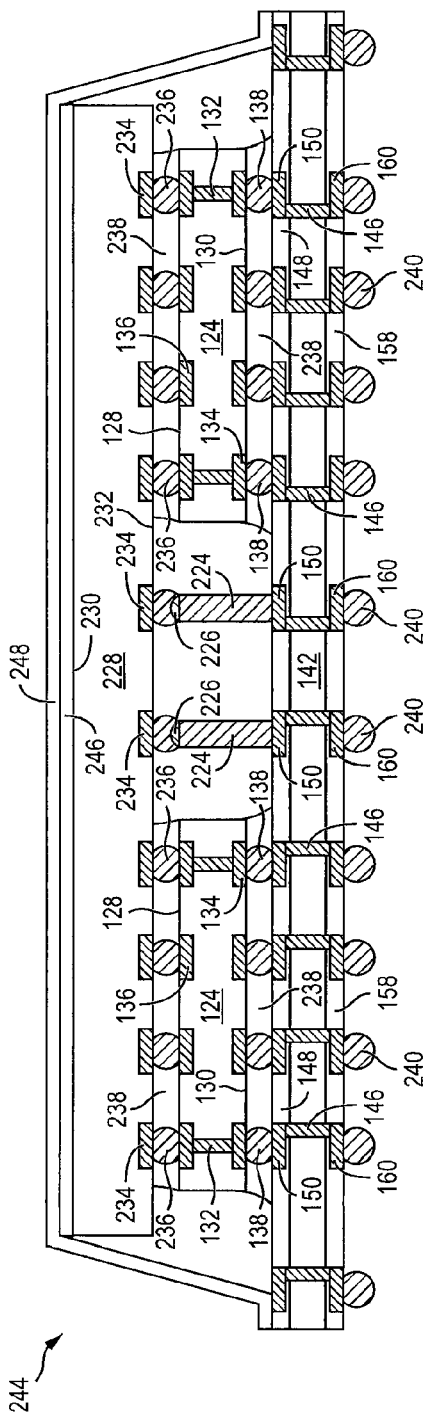
FIG. 10 illustrates the 3D semiconductor package with the conductive pillars and heat spreader.

FIG. 10 shows an embodiment of 3D stacked-die semiconductor package 244, similar to FIG. 9h, with a TIM 246 deposited over back surface 230 of semiconductor die 228. TIM 246 is a thermal epoxy, thermal epoxy resin, or thermal conductive paste. Heat spreader or heat sink 248 is positioned over and mounted to TIM 246 over semiconductor die 228 and conductive layer 150 of semiconductor wafer 142. Heat spreader 248 can be Cu, Al, or other material with high thermal conductivity. Heat spreader 248 and TIM 246 form a thermally conductive path that distributes and dissipates the heat generated by the high frequency electronic components of semiconductor die 124 and 228 and increases the thermal performance of semiconductor package 244. The heat is dissipated radially from heat spreader 248 and through conductive layers 150 and 160, conductive vias 146, and bumps 240 to an external substrate or chassis. By stacking semiconductor die 124 and 228 over semiconductor wafer 142, semiconductor package 244 achieves a high degree of integration while providing effective heat dissipation through TIM 246 and heat spreader 248 for high thermal components such as the GPU in semiconductor die 228.

In another embodiment, an EMI and RFI shielding layer can be formed over semiconductor die 124 and 228 and semiconductor wafer 142, similar to FIG. 6.

Figure 11:
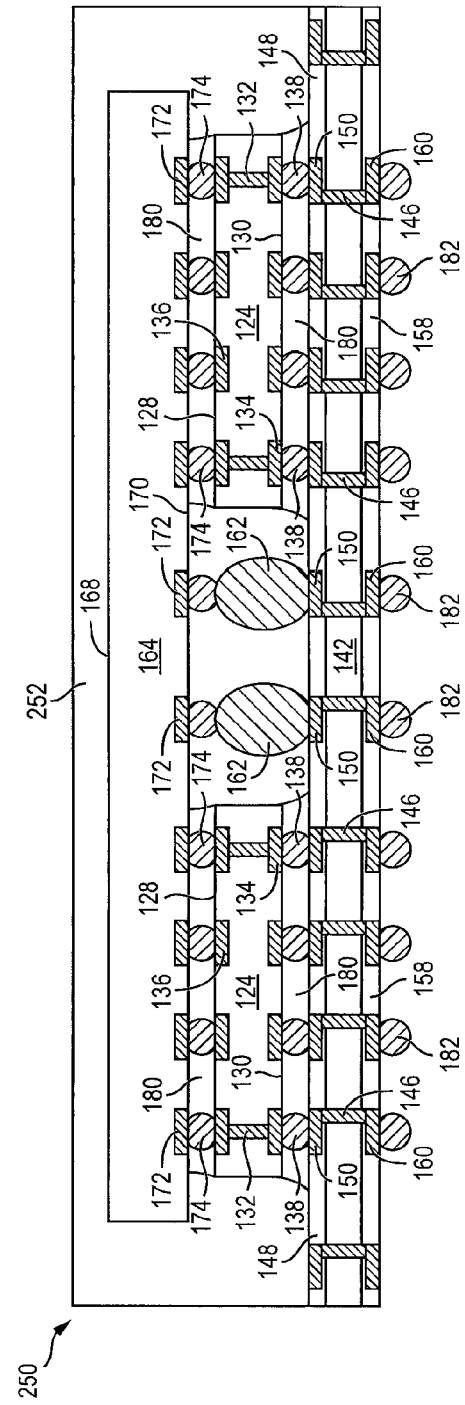
FIG. 11 illustrates the 3D semiconductor package with an encapsulant deposited over the semiconductor die and semiconductor wafer.

FIG. 11 shows an embodiment of 3D stacked-die semiconductor package 250, similar to FIG. 4h, with an encapsulant or molding compound 252 deposited over semiconductor die 124 and 164 and semiconductor wafer 142 using a paste printing, compressive molding, transfer molding, liquid encapsulant molding, vacuum lamination, spin coating, or other suitable applicator. Encapsulant 252 can be polymer composite material, such as epoxy resin with filler, epoxy acrylate with filler, or polymer with proper filler. Encapsulant 252 is non-conductive and environmentally protects the semiconductor device from external elements and contaminants.

Figure 12:
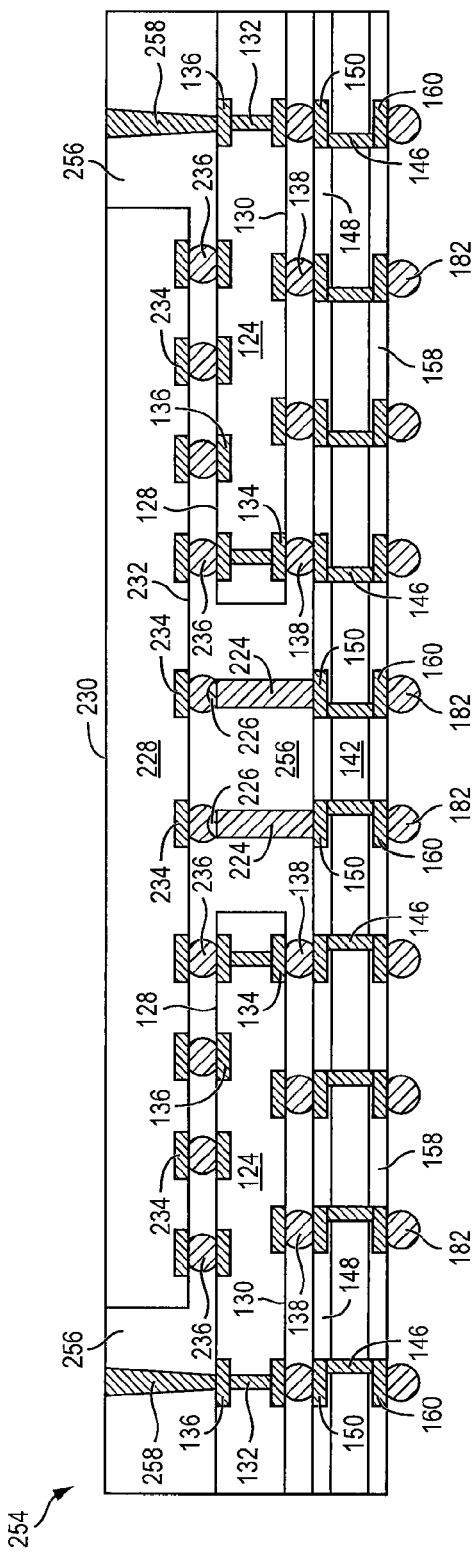
FIG. 12 illustrates the 3D semiconductor package with conductive vias formed through the encapsulant.

FIG. 12 shows an embodiment of semiconductor package 254, similar to FIG. 9h, with semiconductor die 124 extending beyond a footprint of semiconductor die 228. An encapsulant or molding compound 256 is deposited over semiconductor die 124 and 228 and semiconductor wafer 142 using a paste printing, compressive molding, transfer molding, liquid encapsulant molding, vacuum lamination, spin coating, or other suitable applicator. Encapsulant 256 can be polymer composite material, such as epoxy resin with filler, epoxy acrylate with filler, or polymer with proper filler. Encapsulant 256 is non-conductive and environmentally protects the semiconductor device from external elements and contaminants.

A plurality of vias is formed through encapsulant 256 using laser drilling, mechanical drilling, or DRIE. The vias are filled with Al, Cu, Sn, Ni, Au, Ag, Ti, W, poly-silicon, or other suitable electrically conductive material using electrolytic plating, electroless plating process, or other suitable metal deposition process to form z-direction vertical interconnect conductive vias 258. Conductive vias 258 are electrically connected to conductive layer 136 and conductive TSV 132 for additional vertical interconnect to external semiconductor devices. A top surface of conductive vias 258 is exposed from encapsulant 256 for electrical interconnect to external semiconductor devices.

Figure 13:
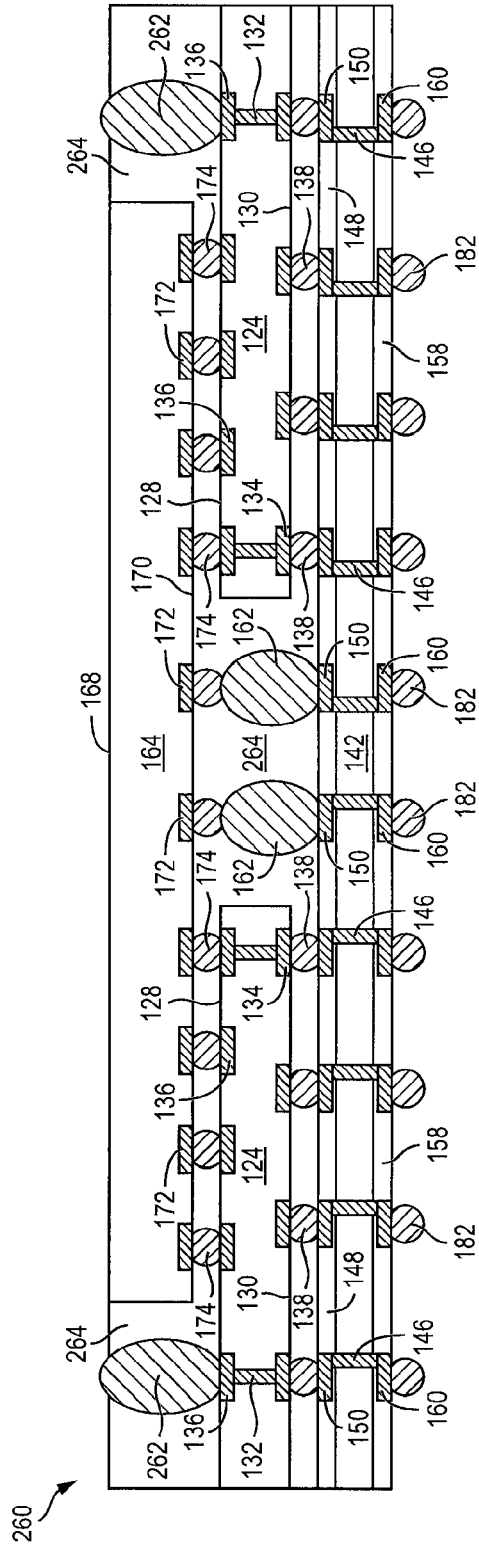
FIG. 13 illustrates the 3D semiconductor package with bumps formed in the encapsulant.
Figure 14:
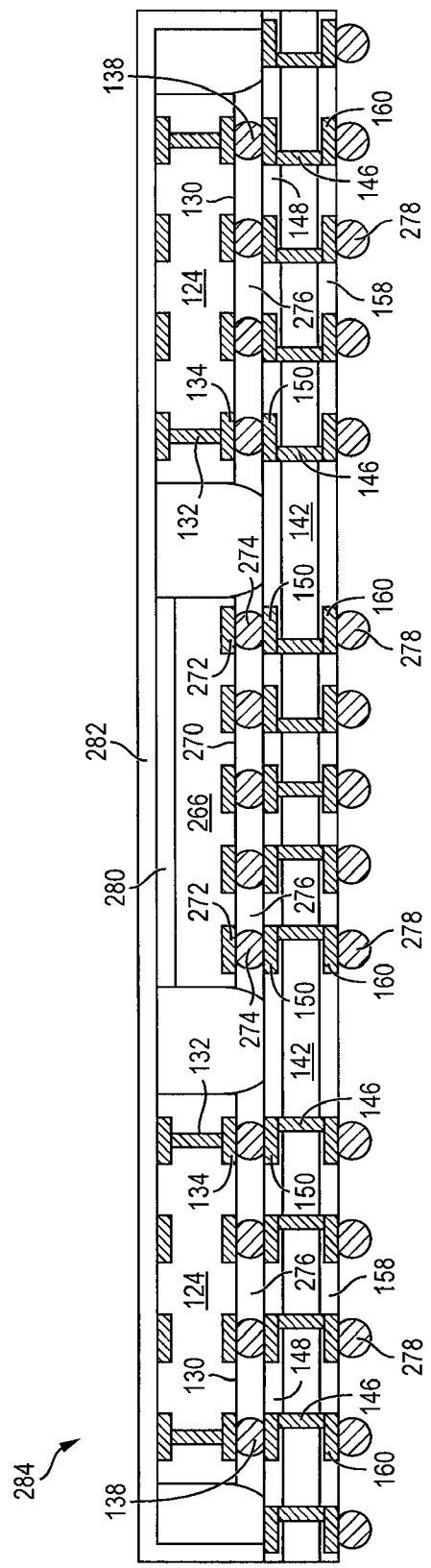
FIG. 14 illustrates the 3D semiconductor package with the semiconductor die mounted to a semiconductor wafer.

FIG. 13 shows an embodiment of semiconductor package 260, similar to FIG. 4h, with semiconductor die 124 extending beyond a footprint of semiconductor die 164. An electrically conductive bump material is deposited over conductive layer 136 of semiconductor die 124 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 136 using a suitable attachment or bonding process. In one embodiment, the bump material is reflowed by heating the material above its melting point to form balls or bumps 262. In some applications, bumps 262 are reflowed a second time to improve electrical contact to conductive layer 136. Bumps 262 can also be compression bonded to conductive layer 136. Bumps 262 represent one type of interconnect structure that can be formed over conductive layer 136. The interconnect structure can also use stud bump, micro bump, or other electrical interconnect.

An encapsulant or molding compound 264 is deposited over semiconductor die 124 and 164, semiconductor wafer 142, and bumps 262 using a paste printing, compressive molding, transfer molding, liquid encapsulant molding, vacuum lamination, spin coating, or other suitable applicator. Encapsulant 264 can be polymer composite material, such as epoxy resin with filler, epoxy acrylate with filler, or polymer with proper filler. Encapsulant 264 is non-conductive and environmentally protects the semiconductor device from external elements and contaminants. A top surface of bumps 262 is exposed from encapsulant 264 for electrical interconnect to external semiconductor devices.

In another embodiment, and continuing from FIG. 4c, semiconductor die 266 has a back surface 268 and active surface 270 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 270 to implement analog circuits or digital circuits, such as GPU, DSP, ASIC, memory, or other signal processing circuit. Semiconductor die 164 may also contain IPDs, such as inductors, capacitors, and resistors, for RF signal processing. A plurality of contact pads 272 is formed on active surface 270 and electrically connected to the circuits on the active surface. A plurality of bumps 274 is formed over contact pads 272. In one embodiment, semiconductor die 266 is a flipchip type die containing a GPU.

Semiconductor die 266 is mounted to semiconductor wafer 142 between semiconductor die 124 using a pick and place operation with active surface 270 oriented toward the semiconductor wafer. An underfill material 276 is deposited between semiconductor die 124 and insulating layer 148 of semiconductor wafer 142 and between semiconductor die 266 and insulating layer 148. The underfill material 276 can be epoxy, epoxy-resin adhesive material, polymeric materials, films, or other non-conductive materials. Alternatively, a MUF material is deposited between semiconductor die 124 and insulating layer 148 of semiconductor wafer 142 and between semiconductor die 266 and insulating layer 148. MUF includes polymer composite material, such as epoxy resin with filler, epoxy acrylate with filler, or polymer with proper filler. MUF can be pumped from a reservoir to a dispensing needle. MUF is injected under pressure from the dispensing needle between semiconductor die 124 and 266 and around bumps 138 and 274. A vacuum assist can draw the MUF to aid with uniform distribution. MUF is non-conductive and environmentally protects the semiconductor device from external elements and contaminants.

An electrically conductive bump material is deposited over conductive layer 160 of semiconductor wafer 142 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 160 using a suitable attachment or bonding process. In one embodiment, the bump material is reflowed by heating the material above its melting point to form balls or bumps 278. In some applications, bumps 278 are reflowed a second time to improve electrical contact to conductive layer 160. Bumps 278 can also be compression bonded to conductive layer 160. Bumps 278 represent one type of interconnect structure that can be formed over conductive layer 160. The interconnect structure can also use stud bump, micro bump, or other electrical interconnect.

A TIM 280 deposited over back surface 268 of semiconductor die 266. TIM 280 is a thermal epoxy, thermal epoxy resin, or thermal conductive paste. Heat spreader or heat sink 282 is positioned over and mounted to TIM 282 over semiconductor die 266 and conductive layer 150 of semiconductor wafer 142. Heat spreader 282 can be Cu, Al, or other material with high thermal conductivity. Heat spreader 282 and TIM 280 form a thermally conductive path that distributes and dissipates the heat generated by the high frequency electronic components of semiconductor die 124 and 266 and increases the thermal performance of semiconductor package 284. The heat is dissipated radially from heat spreader 282 and through conductive layers 150 and 160, conductive vias 146, and bumps 278 to an external substrate or chassis.

In another embodiment, an EMI and RFI shielding layer can be formed over semiconductor die 124 and 266 and semiconductor wafer 142, similar to FIG. 6.

Semiconductor wafer 142 is electrically connected through conductive layers 150 and 160, conductive vias 146, and bumps 138 to semiconductor die 124. Likewise, semiconductor wafer 142 is electrically connected through conductive layers 150 and 160, conductive vias 146, and bumps 278 to semiconductor die 266. In one embodiment, memory circuits in semiconductor die 144 of semiconductor wafer 142 are efficiently connected to interface circuits and signal processing circuits in semiconductor die 124 and GPU in semiconductor die 266, all within a 3D stacked-die semiconductor package 284.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:

providing a substrate formed from a semiconductor material and including a plurality of first conductive vias formed through the substrate;

forming an insulating layer over the substrate and first conductive vias;

removing a portion of the insulating layer to expose the first conductive vias;

depositing a conductive material over the substrate in the insulating layer to form conductive traces in contact with the first conductive vias;

providing a plurality of first semiconductor die including second conductive vias formed through the first semiconductor die;

disposing the plurality of first semiconductor die over the substrate including an active surface oriented toward the substrate;

forming an interconnect structure on the conductive traces and a surface of the substrate outside the first semiconductor die and between side-by-side ones of the first semiconductor die;

disposing a second semiconductor die over the first semiconductor die and coupled to the interconnect structure with each of the first semiconductor die completely within a footprint of the second semiconductor die, the second semiconductor die being electrically connected through the interconnect structure to the conductive traces of the substrate and through the second conductive vias to the first semiconductor die;

disposing a thermal interface material on the second semiconductor die; and disposing a heat spreader over the second semiconductor die and extending to a top surface of the conductive traces of the substrate after disposing the thermal interface material on the second semiconductor die.

2. The method of claim 1, further including depositing an underfill material between the first semiconductor die and substrate.

3. The method of claim 1, further including disposing a discrete electronic component over the substrate.

4. The method of claim 1, wherein the interconnect structure includes conductive pillars.

5. A method of making a semiconductor device, comprising:

providing a substrate;

providing a plurality of first semiconductor die including conductive vias formed through the first semiconductor die;

disposing the plurality of first semiconductor die including conductive vias over a first surface of the substrate including an active surface of the first semiconductor die oriented toward the substrate;

forming an interconnect structure over the substrate and completely outside a footprint of the first semiconductor die; and disposing a second semiconductor die over the first semiconductor die with each one of the first semiconductor die within a footprint of the second semiconductor die, wherein the interconnect structure extends vertically from a first area of the substrate to a second area of the second semiconductor die directly over the first area of the substrate.

6. The method of claim 5, further including disposing a heat spreader on the first surface of the substrate and over the first semiconductor die and second semiconductor die.

7. The method of claim 5, further including depositing an underfill material between the first semiconductor die and substrate.

8. The method of claim 5, further including disposing a discrete electronic component over the substrate.

9. The method of claim 5, wherein the interconnect structure includes bumps or conductive pillars.

10. The method of claim 5, further including:

forming an encapsulant over the first and second semiconductor die and substrate; and forming a plurality of conductive vias through the encapsulant electrically connected to the first semiconductor die.

11. The method of claim 5, further including:

forming an encapsulant over the first and second semiconductor die and substrate; and forming a plurality of bumps within the encapsulant electrically connected to the first semiconductor die.

12. A method of making a semiconductor device, comprising:

providing a substrate;

providing a plurality of first semiconductor die including conductive vias formed through the first semiconductor die;

disposing the plurality of first semiconductor die side-by-side over the substrate;

forming an interconnect structure over the substrate between side surfaces of the first semiconductor die; and disposing a second semiconductor die over each of the first semiconductor die, the second semiconductor die being electrically connected through the interconnect structure to the substrate.

13. The method of claim 12, further including disposing a heat spreader or shielding layer over the first and second semiconductor die and substrate.

14. The method of claim 12, further including depositing an underfill material between the first semiconductor die and substrate.

15. The method of claim 12, further including disposing a discrete electronic component over the substrate.

16. The method of claim 12, wherein the interconnect structure includes bumps or conductive pillars.

17. A semiconductor device, comprising:

a substrate;

a plurality of first semiconductor die disposed side-by-side over the substrate including a plurality of conductive vias formed through the plurality of first semiconductor die;

an interconnect structure formed over the substrate between side surfaces of the first semiconductor die; and a second semiconductor die disposed over the plurality of first semiconductor die and interconnect structure, the second semiconductor die being electrically connected through the interconnect structure to the substrate and through the conductive vias to the first semiconductor die.

18. The semiconductor device of claim 17, further including a heat spreader or shielding layer disposed over the first and second semiconductor die and substrate.

19. The semiconductor device of claim 17, further including an underfill material deposited between the first semiconductor die and substrate.

20. The semiconductor device of claim 17, further including a discrete electronic component disposed over the substrate.

21. The semiconductor device of claim 17, wherein the interconnect structure includes bumps or conductive pillars.

22. The method of claim 1, further including depositing an underfill material between the first and second semiconductor die.

23. The method of claim 1, further including:

forming an insulating layer including an opening in the insulating layer over the substrate;

forming a conductive layer within the opening in the insulating layer to form the interconnect structure; and removing the insulating layer.

24. The method of claim 1, wherein the second semiconductor die includes a graphics processing unit (GPU).

25. The method of claim 1, wherein the substrate includes a memory component.

* * * * *